(12) United States Patent
Damodaran et al.

(10) Patent No.: US 8,904,249 B2
(45) Date of Patent: Dec. 2, 2014

(54) AT SPEED TESTING OF HIGH PERFORMANCE MEMORIES WITH A MULTI-PORT BIS ENGINE

(75) Inventors: Raguram Damodaran, Plano, TX (US); Naveen Bhoria, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 273 days.

(21) Appl. No.: 13/447,193

(22) Filed: Apr. 14, 2012

(65) Prior Publication Data

US 2013/0275822 A1 Oct. 17, 2013

(51) Int. Cl.
 *G11C 29/00* (2006.01)
(52) U.S. Cl.
 USPC .......................................... 714/718; 714/730
(58) Field of Classification Search
 CPC ................................ G11C 29/56; G11C 29/48
 USPC ............................................ 714/718, 730, 30
 See application file for complete search history.

(56) References Cited

U.S. PATENT DOCUMENTS

| 6,550,032 | B1 * | 4/2003 | Zhao et al. .................... 714/730 |
| 8,042,011 | B2 * | 10/2011 | Nicolaidis et al. ............. 714/718 |
| 8,549,368 | B1 * | 10/2013 | Deogharia et al. ............. 714/727 |
| 8,634,263 | B2 * | 1/2014 | Kenkare et al. ............... 365/201 |

\* cited by examiner

*Primary Examiner* — Fritz Alphonse
(74) *Attorney, Agent, or Firm* — Robert D. Marshall, Jr.; Frederick J. Telecky, Jr.

(57) ABSTRACT

A programmable Built In Self Test (BIST) system used to test embedded memories where the memories may be operating at a clock frequency higher than the operating frequency of the BIST. A plurality of BIST memory ports are used to generate multiple memory test instructions in parallel, and the parallel instructions are then merged to generate a single memory test instruction stream at a speed that is a multiple of the BIST operating frequency.

4 Claims, 2 Drawing Sheets

AT SPEED TESTING OF HIGH PERFORMANCE MEMORIES WITH A MULTI-PORT BIS ENGINE

TECHNICAL FIELD OF THE INVENTION

The technical field of this invention is high speed memory testing, and more particularly a built-in self-test (BIST) system for embedded memories.

BACKGROUND OF THE INVENTION

It is becoming more and more common for integrated circuits to include embedded memory to allow rapid access to data by processing logic provided on the integrated circuit. As the use of embedded memory continues to increase, thorough testing and defect diagnosis has become a key requirement to ensure product quality and enhance product yield. While embedded memory presents significant system performance and cost reduction advantages, it brings its own testing issues. Externally generated test vector style tests are not suitable for verifying embedded memory arrays for a number of reasons. First, the time spent in the manufacturing test grows exponentially as the embedded memory die area increases, which often makes such test vector style testing too costly. Furthermore, it is sometimes not possible to create a set of vectors that can detect all possible types of memory defect.

A known technique which alleviates such problems is to provide the integrated circuit with a memory Built In Self-Test (BIST) controller. In simplistic terms, a memory BIST controller is an on-chip utility that enables the execution of a proven set of algorithmic style verification tests directly on the embedded memory. These tests can be executed at the design's full operating frequency to prove the memory operations and identify errors caused by silicon defects.

SUMMARY OF THE INVENTION

An SOC (System On Chip) usually contains a plurality of embedded memory systems, and some of these embedded memories may be operating at different speeds. It is desirable to test all the embedded memory with a single BIST engine, however designing the BIST to operate at the speed of the fastest memory may result in an unacceptable increase of the die size and cost.

This invention describes an embedded memory test system wherein a multi-port BIST engine is employed that is capable of testing embedded memories at full speed while operating at a speed lower than the speed of the fastest memory.

BRIEF DESCRIPTION OF THE DRAWINGS

These and other aspects of this invention are illustrated in the drawings, in which.

DETAILED DESCRIPTION OF PREFERRED EMBODIMENTS

The BIST architecture consists of a small CPU with an instruction set targeted specifically towards testing memories. This CPU includes both control and instruction registers necessary to execute the individual memory algorithms. Once an algorithm is loaded into the instruction registers, it can be run on multiple memories of different sizes or types by changing the control register to shorten test load overhead. The memory configuration information can be stored into on-chip memory (ROM or SRAM) to further lower the test load overhead. The test algorithm code can also be loaded into on-chip memory to avoid all test loading such that only the execute command is necessarily loaded by the tester.

The functionality of BIST is similar to using an embedded CPU to test the memories in that you have the flexibility to add, subtract, or adjust algorithms without changing the silicon. It differs in these ways:

BIST is easily programmable. Embedded CPUs are designed for their targeted use and are often not easily programmed for memory test algorithms.

Embedded CPUs require more time to develop the algorithm code.

The algorithm code for embedded CPUs is significantly larger than that needed for programmable built-in self-test.

For embedded CPUs, the code must be optimized for each memory type and size.

Figure 1:
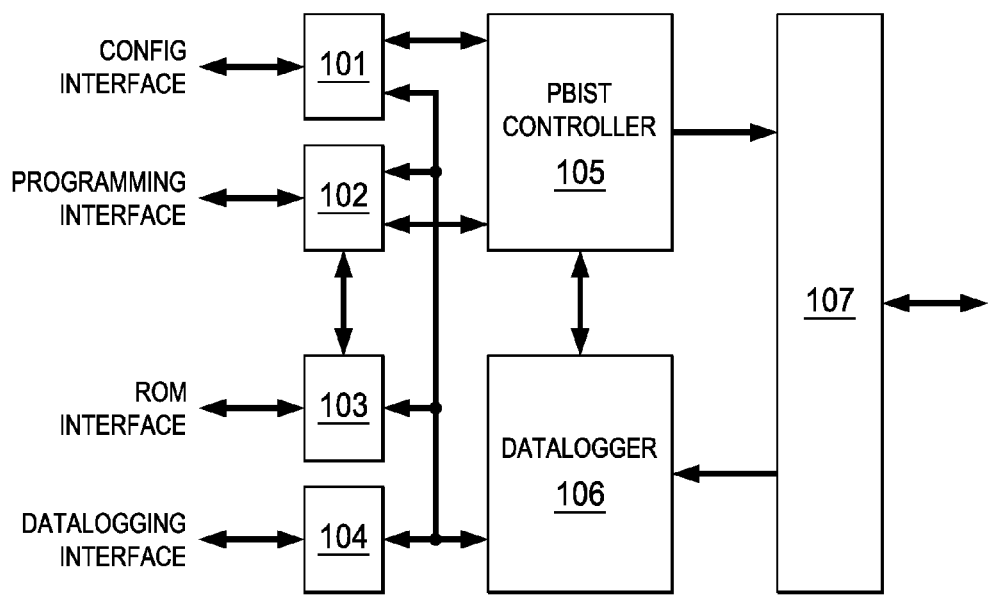
FIG. 1 is a block diagram of one implementation of a BIST engine.

FIG. 1 shows one implementation of a programmable BIST architecture. Configuration data is provided through configuration interface 101 and defines the embedded memories to be tested. The test program is loaded into the BIST through programming interface 102, while interface 104 provides access to the BIST's internal Read Only Memory (ROM). Interface 104 is the data logging interface, providing access to the memory test results logged by data logger 106. BIST controller 105 comprises of a small CPU operable to execute a specialized small instruction set targeted towards efficient memory testing. Data logger 106 is programmable to record selected memory statistics and testing results. Datapath block 107 comprises multiple interfaces connecting to the embedded memories to be tested.

Figure 2:
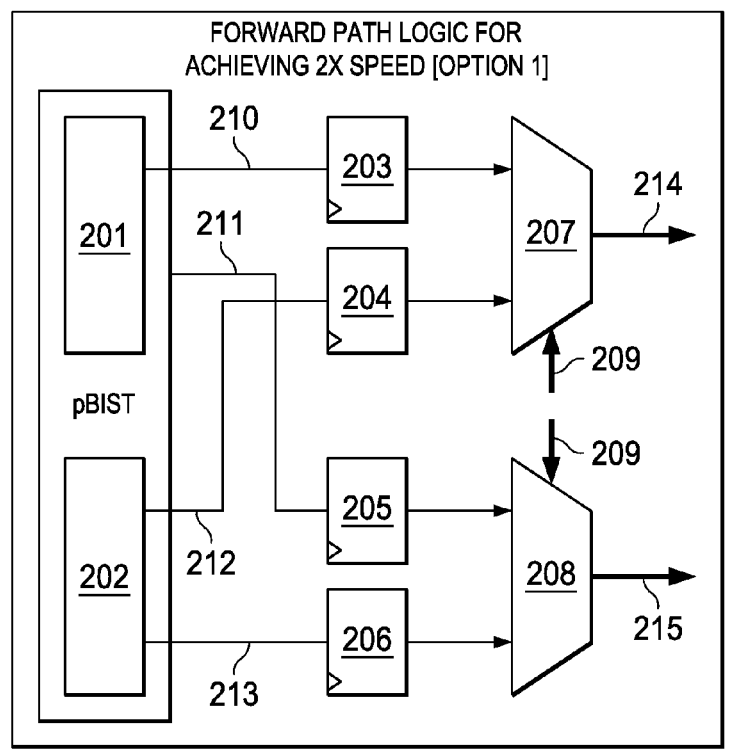
FIG. 2 illustrates one implementation of the forward data path of the BIST.

FIG. 2 illustrates one embodiment of the invention using a two port BIST operating at clock rate CLK2, interfaced to an embedded memory operating at clock rate CLK1, where CLK2 is one half of the CLK1 clock rate. BIST ports 201 and 202 are programmed to output memory address and data in parallel, each port outputting one address/data set once per CLK2 clock period. Data output 210 from BIST port 201 is connected to register 203 clocked by CLK1. Address output 211 from BIST port 201 is connected to register 205 clocked by CLK1. Data output 212 from BIST port 202 is connected to register 204 clocked by CLK2. Address output 213 from BIST port 202 is connected to register 206 clocked by CLK2.

Latched data and address outputs from registers 203 and 204 are connected to two input multiplexer 207, while the outputs of registers 205 and 206 are connected to multiplexer 208. Clock signal CLK1 is connected to the select inputs 209 of multiplexers 207 and 208, thus selecting BIST port 201 or port 201 address and data on each CLK1 cycle, merging the data from the two BIST ports into a single stream of data at twice the BIST clock rate.

Figure 3:
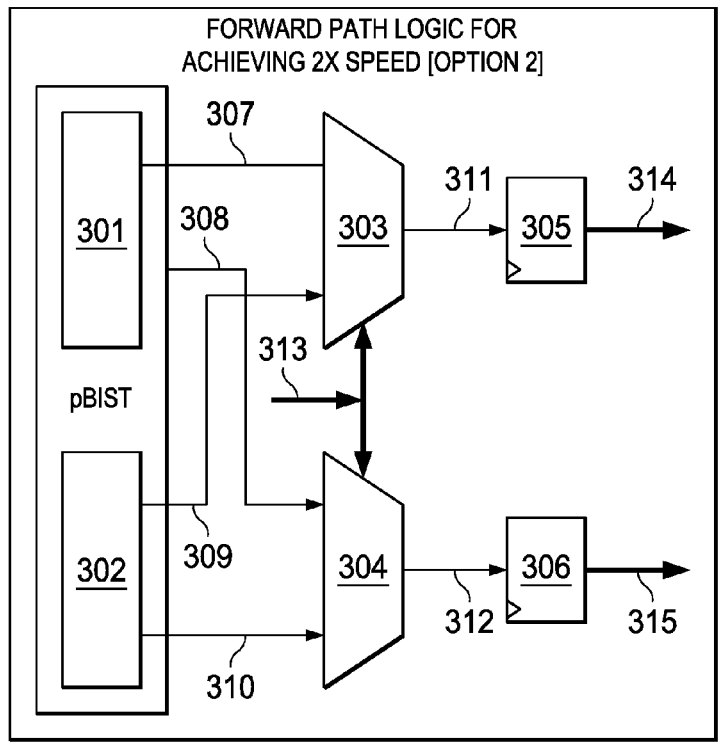
FIG. 3 illustrates an alternate implementation of the forward data path.

FIG. 3 illustrates an alternate implementation wherein data output 307 from BIST port 301 is connected to the first input of multiplexer 303, and data output 309 from BIST port 302 is connected to the second input of multiplexer 303. Address output 308 from BIST port 302 is connected to the first input of multiplexer 304, and address output 310 from BIST port 302 is connected to the second input of multiplexer 304. Select input 313 of multiplexers 303 and 304 is connected to CLK1, thus selecting address and data information consecutively from BIST ports 201 and 201.

Data output 311 from multiplexer 303 is latched in register 305 clocked by CLK1, with the output of register 305 providing memory test data 314. Address output 312 from multiplexer 304 is latched in register 306 clocked by CLK1, with the output of register 306 providing memory address 315.

Figure 4:
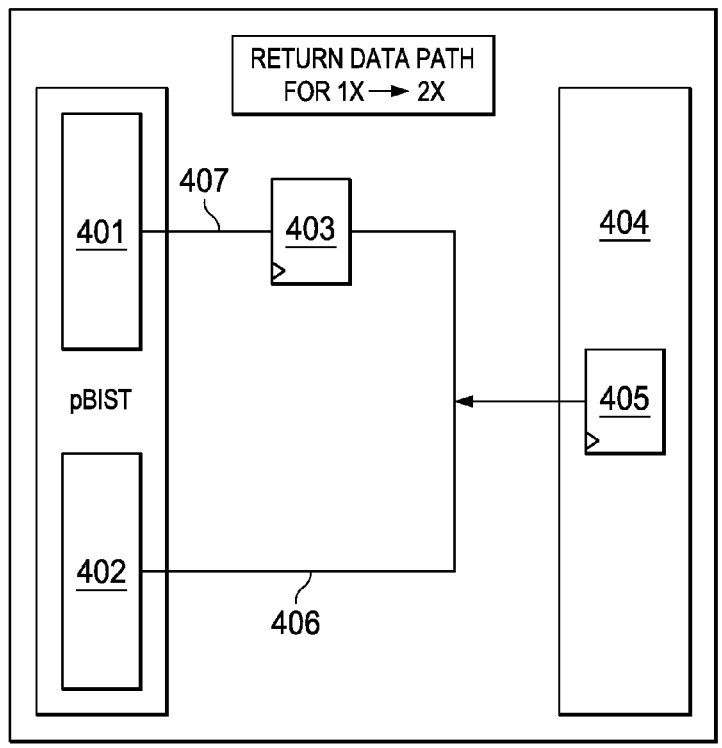
FIG. 4 illustrates the return data path.

FIG. 4 illustrates the return data path from the embedded memory under test to the BIST. Data output from memory 404 is latched in register 405, clocked by CLK1. The output of register 405 is connected to read input 406 of BIST port 402, and is also connected to the input of register 403 clocked by CLK1. The output of register 403 is connected to read input 407 of BIST port 401, thus effectively demultiplexing the Higher speed memory data.

What is claimed is:

1. A method of embedded memory testing comprising the steps of:
    a multi port built-in self-test engine generating a plurality of memory addresses and test data in parallel;
    merging said memory addresses and test data into a single higher clock rate memory test stream;
    writing said memory test stream into an embedded memory under test;
    reading resultant memory data from the memory under test;
    de-multiplexing said memory data into a plurality of parallel data streams operating at a lower clock rate; and
    applying said memory data to the built-in self-test port that generated the original data.

2. An embedded memory test system comprising of:
    a multi port built-in self-test engine operable to generate a plurality of memory addresses and memory test data in parallel;
    a plurality of registers operable to store said memory addresses;
    a plurality of registers operable to store said memory test data;
    an address and a test data multiplexer connected to the output of said registers operable to consecutively select address/test data pairs generated by said multi port built-in self-test, thus converting the address and test data sets generated in parallel streams into a single higher speed memory test stream.

3. The embedded memory test system of claim 2 wherein:
    the clock rate of the merged address and test data stream is a multiple of the clock rate at which the multi port built-in self-test generates address and test data.

4. The embedded memory test system of claim 2 wherein:
    the clock rate of the merged address and test data stream is equal to the clock rate of the multi port built-in self-test multiplied by the number of built-in self-test ports.

* * * * *